(12) United States Patent
Son et al.

(10) Patent No.: US 11,247,823 B2
(45) Date of Patent: Feb. 15, 2022

(54) FERMENTED FOOD PACKING POUCH, FERMENTED FOOD PACKING METHOD USING SAME, AND PACKING POUCH

(71) Applicant: CJ CHEILJEDANG CORPORATION, Seoul (KR)

(72) Inventors: Dong Rag Son, Seoul (KR); Kyoung Sik Cho, Seoul (KR); Yoon Seung Nam, Seoul (KR); Kwang Soo Park, Gwacheon-si (KR); Hui Jae Song, Seoul (KR); Gyu Hwan Cha, Seoul (KR)

(73) Assignee: CJ CHEILJEDANG CORPORATION, Seoul (KR)

( * ) Notice: Subject to any disclaimer, the term of this patent is extended or adjusted under 35 U.S.C. 154(b) by 0 days.

(21) Appl. No.: 16/966,724

(22) PCT Filed: Dec. 17, 2018

(86) PCT No.: PCT/KR2018/015968
§ 371 (c)(1),
(2) Date: Jul. 31, 2020

(87) PCT Pub. No.: WO2019/156333
PCT Pub. Date: Aug. 15, 2019

(65) Prior Publication Data
US 2020/0361687 A1    Nov. 19, 2020

(30) Foreign Application Priority Data

Feb. 7, 2018  (KR) .................. 10-2018-0015236
Oct. 24, 2018  (KR) .................. 10-2018-0127698

(51) Int. Cl.
B65D 77/00   (2006.01)
B65D 77/22   (2006.01)
(Continued)

(52) U.S. Cl.
CPC .............. B65D 77/225 (2013.01); B65B 7/08 (2013.01); B65B 25/001 (2013.01); B65B 51/10 (2013.01); B65D 75/008 (2013.01); B65D 77/14 (2013.01)

(58) Field of Classification Search
CPC .... B65D 77/225; B65D 77/14; B65D 75/008; B65B 7/08; B65B 25/001; B65B 51/10
(Continued)

(56) References Cited

U.S. PATENT DOCUMENTS 2,083,543 A  *  6/1937  Baum .................... A47G 25/54
                                                    206/280
3,646,723 A  *  3/1972  Meroney ............. B65B 67/1266
                                                    53/390

(Continued)

FOREIGN PATENT DOCUMENTS

JP    1993068804 U    9/1993
JP    11240579 A      9/1999
(Continued)

OTHER PUBLICATIONS

International Search Report for PCT/KR2018/015968 dated Mar. 25, 2019.
Korean notice of allowance for application No. 10-2018-0127698 dated Jul. 8, 2020.
Korean office action for application No. 10-2018-0127698, dated Apr. 23, 2020.
(Continued)

*Primary Examiner* — Peter N Helvey
(74) *Attorney, Agent, or Firm* — Cantor Colburn LLP

(57) ABSTRACT

One or more embodiments of the present disclosure relate to a pouch for packaging fermented foods, a method of packaging fermented foods using the same, and a pouch for packaging.

12 Claims, 15 Drawing Sheets

(51) Int. Cl.
*B65B 7/08* (2006.01)
*B65B 25/00* (2006.01)
*B65B 51/10* (2006.01)
*B65D 75/00* (2006.01)
*B65D 77/14* (2006.01)

(58) Field of Classification Search
USPC .................................................... 383/10, 23
See application file for complete search history.

(56) References Cited

U.S. PATENT DOCUMENTS

| 4,772,278 | A | * | 9/1988 | Baber | ............... | A61M 1/69 |
| | | | | | | 604/324 |
| 4,953,708 | A | * | 9/1990 | Beer | ............... | B65D 33/08 |
| | | | | | | 383/17 |
| 2011/0103716 | A1 | | 5/2011 | Reilly | | |

FOREIGN PATENT DOCUMENTS

| JP | 2000025795 A | 1/2000 |
| JP | 4145950 B2 | 6/2008 |
| JP | 2009023683 A | 2/2009 |
| JP | 2016030010 A | 3/2016 |
| JP | 2017105491 A | 6/2017 |
| KR | 1020040006888 A | 1/2004 |
| KR | 1020060052873 A | 5/2006 |
| KR | 2020110011568 U | 12/2011 |

OTHER PUBLICATIONS

Korean office action for application No. 10-2018-0127698, dated Oct. 8, 2019.
Written Opinion for PCT/KR2018/015968 dated Mar. 25, 2019.
Extended European Search Report for Application No. 18905261.6 dated Sep. 15, 2021.
Japanese Office Action for Application No. 2020-542578 dated Aug. 30, 2021.

* cited by examiner

FERMENTED FOOD PACKING POUCH, FERMENTED FOOD PACKING METHOD USING SAME, AND PACKING POUCH

TECHNICAL FIELD

One or more embodiments of the present disclosure relate to a pouch for packaging fermented foods, a method of packaging fermented foods using the same, and a pouch for packaging.

BACKGROUND ART

Fermented foods such as kimchi and the like continue to ferment during the distribution process after being packaged, and accordingly gas is discharged.

Apart from fermented foods, gas may be generated from various products such as food products, industrial products, and the like, and such gas increases the volume of a pouch in which a product is stored. Therefore, such gas may damage packaging such as a pouch or the like, thus degrading the quality of the product.

For such a reason, fermented food manufacturers use a method of attaching a gas absorbent to the packaging or do not seal a portion of a product inlet of the packaging means so that such gas is allowed to be discharged.

However, when the gas absorbent is attached to the packaging means, micro-pores on a surface of the gas absorbent tissue are blocked by a liquid of the fermented food, or when the gas absorbent exceeds an absorption limit, no more gas is absorbed, and thus gas generated from the fermented food damages the packaging. In addition, when a portion of the product inlet of the packaging is not sealed, the liquid of the fermented food leaks through an unsealed portion, which causes inconvenience for consumers. Moreover, the product is contaminated by foreign matter penetrating through the unsealed portion.

In order to overcome such limitations, as disclosed in Korean Utility Model Publication No. 20-2011-0011568 (published date: Dec. 15, 2011), etc., a complex labyrinth structure is introduced into a container, so that such gas is discharged while fermented foods such as liquids and the like do not leak out.

However, the labyrinth structure is applicable only to a container for packaging including a separate cover which is sealed by the cover after a fermented food is put thereinto. It is difficult to apply the labyrinth structure to a pouch for packaging which is sealed through sealing and the like after the fermented food is put therein.

DESCRIPTION OF EMBODIMENTS

Technical Problem

In order to solve the existing problems described above, one or more embodiments of the present disclosure provide a pouch for packaging fermented foods that is able to prevent product damage due to gas without using a gas absorbent by allowing the gas to be discharged through a labyrinth sealing portion, and a method of packaging fermented foods using the same.

In addition, one or more embodiments of the present disclosure provide a pouch for packaging that is able to prevent leakage of a liquid while allowing gas generated therefrom to be discharged, and also prevent foreign matter and the like from penetrating from outside.

Moreover, one or more embodiments of the present disclosure provide a pouch for packaging in which a configuration of a product inlet and a gas discharge portion is simple, and of which manufacturing costs are reduced.

Solution to Problem

According to an aspect of the present disclosure, a pouch for packaging fermented foods includes: a body formed in a bag shape; a product inlet formed to communicate with the inside of the body; and a gas discharge portion that is formed to communicate with the inside of the body and the product inlet and includes a plural-branched labyrinth sealing portion.

According to another aspect of the present disclosure, a method of packaging fermented foods includes:

preparing a pouch for packaging fermented foods including a body formed in a bag shape, a product inlet formed to communicate with the inside of the body, and a gas discharge portion that is formed to communicate with the inside of the body and the product inlet and includes a plural-branched labyrinth sealing portion (a); putting a fermented food into the pouch for packaging fermented foods (b); and sealing the pouch for packaging fermented foods (c).

According to another aspect of the present disclosure, a pouch for packaging fermented foods includes a body formed in a bag shape and a gas discharge portion including a labyrinth sealing portion that communicates with the inside of the body and includes a plurality of sealing areas and an open area between the sealing areas, wherein the gas discharge portion includes: a first region that is located at a lower portion and at least a portion thereof communicates with the inside of the body; a second region that is located on the first region to be connected to the first region and includes a connection line having a certain length; and a third region that is located at an upper portion of the second region to be connected to the second region and includes a discharge line, and the gas discharge portion includes a circulation area having a certain surface area, in which a circulation structure that returns a leaking liquid to the body is formed.

According to another aspect of the present disclosure, a pouch for packaging includes: a body formed in a bag shape; a product inlet formed to communicate with the inside of the body; and a gas discharge portion formed to communicate with the inside of the body and the product inlet.

Advantageous Effects of Disclosure

A pouch for packaging fermented foods according to one or more embodiments of the present disclosure includes a gas discharge portion including a labyrinth sealing portion. Therefore, a liquid of a fermented food in a body may be prevented from leaking by the labyrinth sealing portion in the distribution process, and gas generated from the fermented food may be smoothly discharged, thus preventing damage of the product due to the gas without using a gas absorbent.

In addition, as the gas discharge portion according to an embodiment of the present disclosure is provided, the gas generated from the product may be discharged, and at the same time the liquid may be prevented from leaking. Moreover, foreign matter may be prevented from penetrating, thus securing hygiene.

According to an embodiment, an outer skin portion and an inner skin portion are provided, and the inner skin portion forms an inner surface of a product inlet and a gas discharge portion. Thus, a configuration process of the product inlet and the gas discharge portion may be simplified, which leads to the reduction of the manufacturing costs.

BEST MODE

According to an aspect of the present disclosure, a pouch for packaging fermented foods includes: a body formed in a bag shape; a product inlet formed to communicate with the inside of the body; and a gas discharge portion that is formed to communicate with the inside of the body and the product inlet and includes a plural-branched labyrinth sealing portion.

MODE OF DISCLOSURE

Hereinafter, preferred embodiments of the present disclosure will be described with reference to the accompanying drawings.

Figure 1:
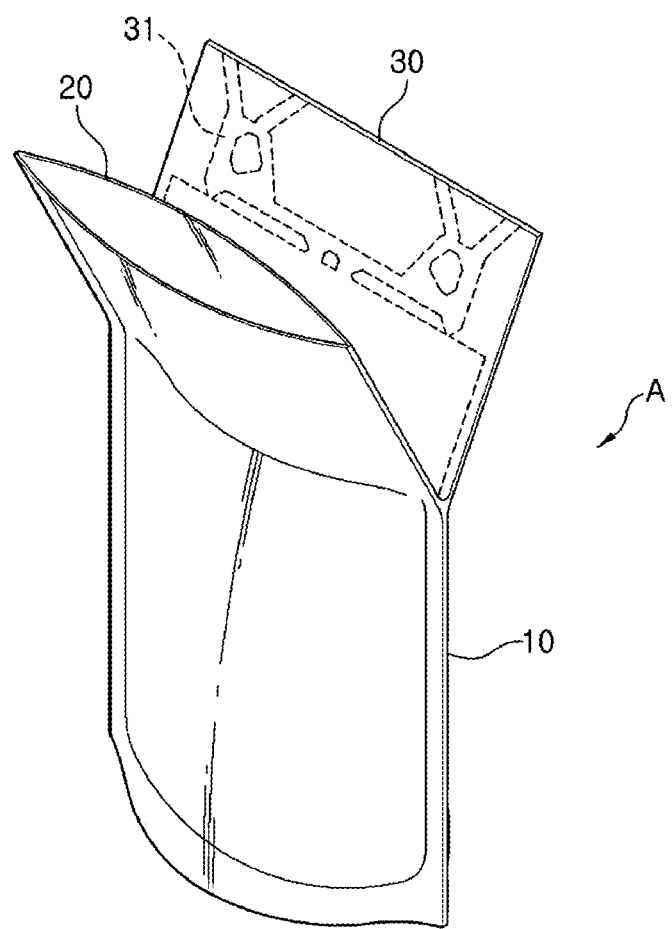
FIG. 1 is a perspective view of a pouch, in an unused state, for packaging fermented foods and illustrates illustrating a structure of the pouch for packaging fermented foods, according to an embodiment of the present disclosure.
Figure 2:
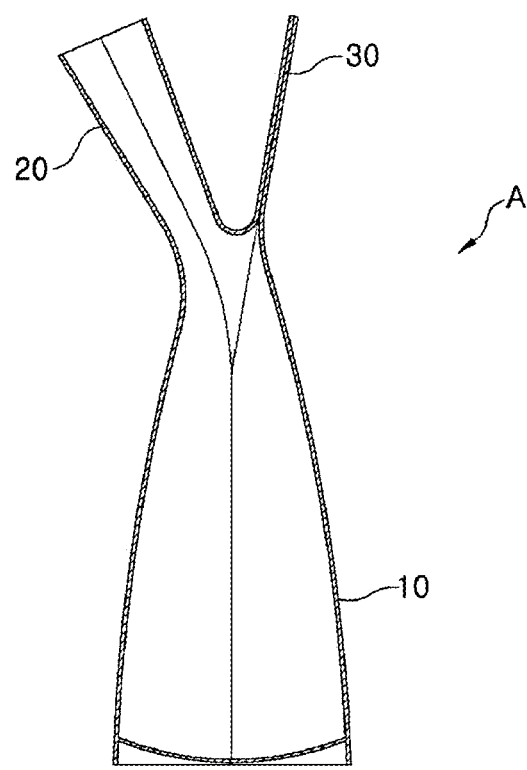
FIG. 2 is a cross-sectional view of a pouch, in an unused state, for packaging fermented foods and illustrates a structure of the pouch for packaging fermented foods, according to an embodiment of the present disclosure.

Referring to FIGS. 1 and 2, a pouch for packaging fermented foods A according to one or more embodiments of the present disclosure includes: a body 10; a product inlet 20; and a gas discharge portion 30.

Embodiments of the present disclosure will be described in detail.

The body 10 is formed in a bag shape.

Therefore, a fermented food 100 of a certain capacity may be accommodated through an inner space of the body 10.

In that case, the fermented food 100 is a food that discharges gas when the product is stored (production, distribution, and sale), and may include powder or a liquid such as kimchi, sauce, salted fish, natto, pickles, fermented milk (yogurt and the like), and fermented liquor (makgoelli, beer, and wine).

The product inlet 20 is formed to communicate with an inner space of the body 10.

Therefore, an upper end of the product inlet 20 may be opened and then a fermented food injector 200 may be input to accommodate the fermented food 100 discharged from the fermented food injector 200 in the body 10.

Figure 3:
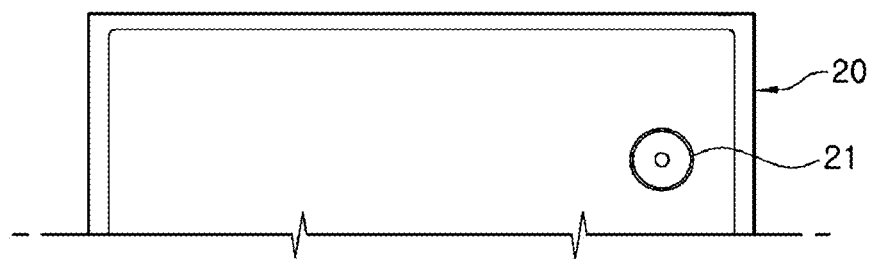
FIG. 3 is an example view showing an example of a valve formed in a product inlet within a pouch for packaging fermented foods, according to an embodiment of the present disclosure.

Referring to FIG. 3, the product inlet 20 may include a valve 21.

Therefore, when a relatively large amount of gas is generated from the fermented food 100 accommodated in the body 10, the gas may be discharged smoothly as the valve 21 of the product inlet 20 is opened.

The valve 21 may be of any structure as long as it is able to discharge gas when opened, and an example of the valve 21 may include an automatic on-off valve that automatically opens at allowable pressure or higher.

A guide portion (not shown) may be provided in the product inlet 20 to seal or fold the product inlet 20 after the fermented food 100 is input.

The guide portion may be any portion without limitation as long as it is able to perform a corresponding function as a virtual or real portion.

More specifically, the product inlet 20 may include a fold guide portion, and the fold guide portion may be included at a rear end of the product inlet 20. The product inlet 20 is folded downward by the fold guide portion after the fermented food 100 is put into the body 10, which may limit the fermented food 100 accommodated in the body 10 moving toward the product inlet 20. Therefore, even when the valve 21 is included in the product inlet 20, the discharge of the fermented food 100 through the valve 21 may be prevented. A folded portion of the product inlet 20 applies certain pressure so that the gas is discharged to the gas discharge portion 30 at normal times, and the gas may be allowed to be discharged through the valve 21 as the folded portion is released at the allowable pressure or higher.

The product inlet 20 may include a sealing guide portion, and the sealing guide portion may be included at a front end of the product inlet 20. More specifically, the sealing guide portion may be formed closer to the front end of the product inlet 20 than the valve 21.

In that case, the sealing guide portion may be sealed by any conventional sealing method, but as an example, a heat seal sealing may be used. Gas and the fermented food 100 may be prevented through such sealing from being discharged from the product inlet 20.

The gas discharge portion 30 is formed to communicate with the body 10 and the product inlet 20, and a plural-branched labyrinth sealing portion 31 is formed therein. The labyrinth sealing portion 31 may be formed in various configurations as shown in FIGS. 4 to 8.

Figure 4:
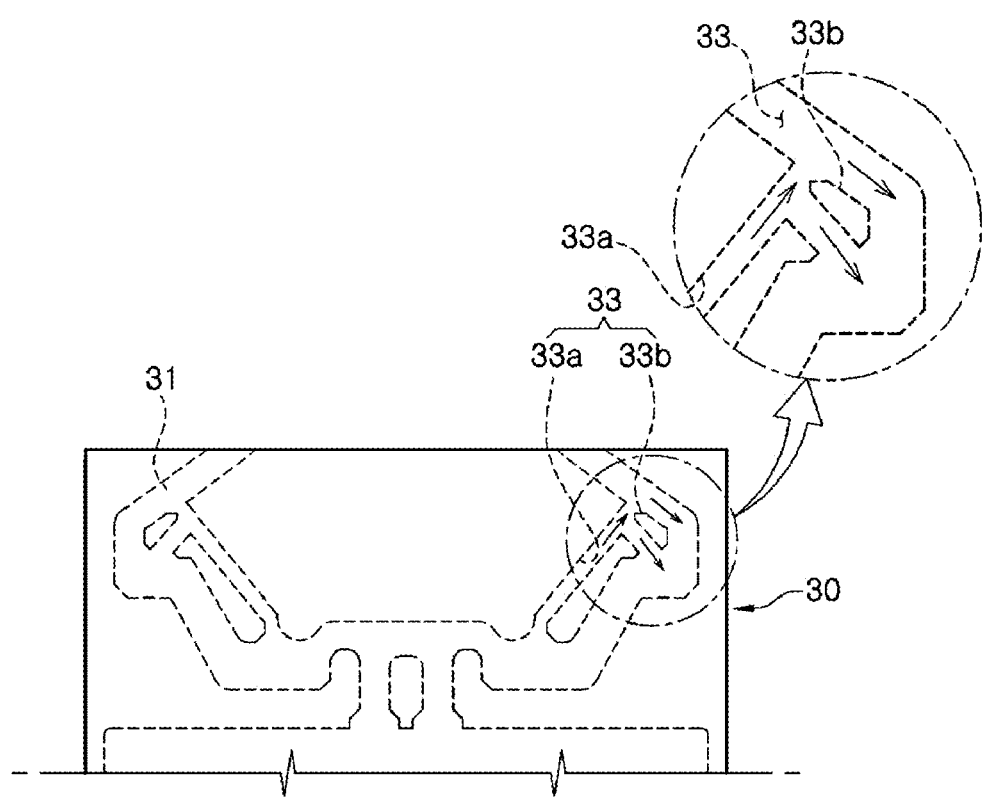
FIGS. 4 to 8 are diagrams showing various embodiments of a labyrinth sealing portion applied to a gas discharge portion, according to an embodiment of the present disclosure.

More specifically, referring to FIG. 4, the labyrinth sealing portion 31 includes a passage portion 33 and a sealing portion 35, and may allow only gas in the body 10 to be discharged and prevent the fermented food 100 from being discharged. The labyrinth sealing portion 31 may be formed in any configuration. More specifically, the passage portion 33 may include a downward inclined portion 33b in communication with an upward inclined portion 33a, and a non-gas material is guided downward through the downward inclined portion 33b, thereby preventing the non-gas material from being discharged to the outside.

Figure 5:
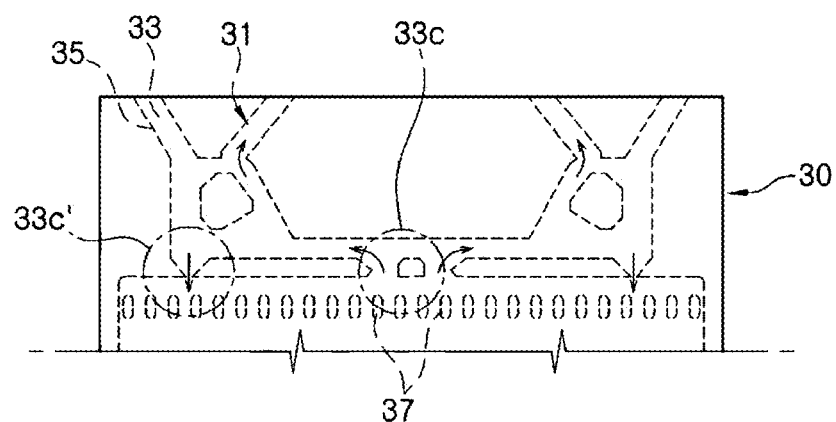

Alternatively, by applying a bottleneck structure 33c in communication with the inside of the body 10 to the labyrinth sealing portion 31, discharge pressure of the gas discharge portion 30 may be increased, and by forming a liquid inlet having a relatively small width within the bottleneck structure 33c, a liquid flowing into the labyrinth sealing portion 31 may be introduced back into the body 10, as shown in FIG. 5. In addition to that, a liquid outlet 33c' may be provided in the labyrinth sealing portion 31 to allow the liquid flowing into the labyrinth sealing portion 31 through the bottleneck structure 33c to be discharged back into the body 10. Since the discharge pressure of the gas discharge portion 30 is increased by the bottleneck structure 33c, foreign matter may be prevented from penetrating from outside.

Figure 6:
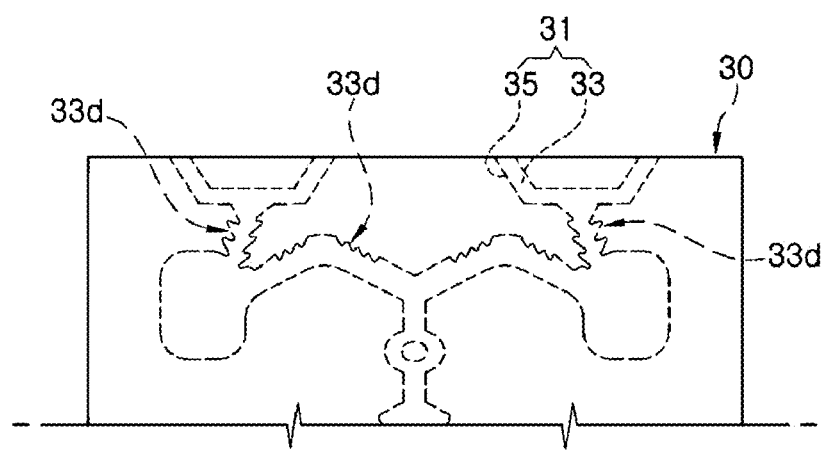

Alternatively, the labyrinth sealing portion 31 includes a plurality of protrusion portions 33d, and the non-gas material may be prevented from moving upward the gas discharge portion 30 along the upward inclined portion 33a, as shown in FIG. 6. In other words, a liquid other than the gas moving along the upward inclined portion 323a is caught by the protrusion portions 33d and at the same time drops by gravity to be introduced back into the body 10.

Thanks to such configuration of the labyrinth sealing portion 31, only gas generated from the fermented food 100 accommodated in the body 10 may be discharged and the fermented food 100 may be prevented from being discharged.

As long as the labyrinth sealing portion 31 may discharge only gas generated from the fermented food 100 and prevent the fermented food 100 from being discharged, the labyrinth sealing portion 31 may be configured in various shapes as shown in FIGS. 4 to 8.

The gas discharge portion 30 may include a dot sealing portion 37 (refer to FIG. 5).

Accordingly, robustness of sealing of the gas discharge portion 30 as well as durability may be increased by the dot sealing portion 37.

The dot sealing portion 37 may be formed at a lower portion of the labyrinth sealing portion 31.

Figure 9:
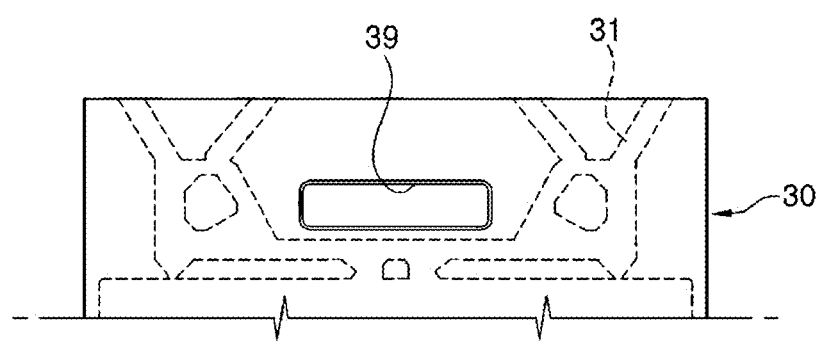
FIG. 9 is an example view showing an example of a handle formed in a gas discharge portion within a pouch for packaging fermented foods, according to an embodiment of the present disclosure.
Figure 10:
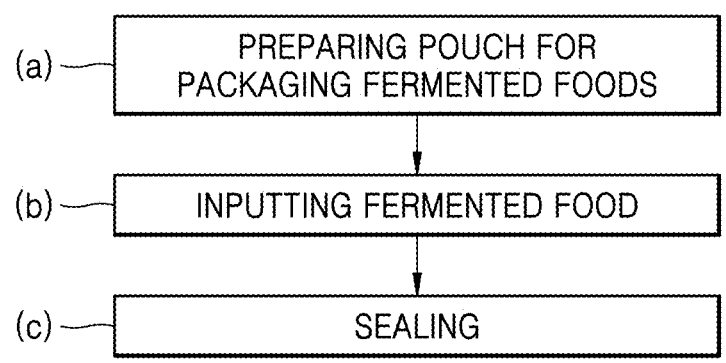
FIG. 10 is a schematic process diagram illustrating a method of packaging fermented foods, according to an embodiment of the present disclosure.

Referring to FIG. 9, the gas discharge portion 30 may further include a handle 39.

Since the gas discharge portion 30 includes the handle 39, gripping may be stabilized, thus it may be easy to transport the pouch for packaging fermented foods A according to one or more embodiments of the present disclosure. In addition, since the gas discharge portion 30 includes the handle 39, it may be possible to induce the product inlet 20 to be folded in the distribution process of the pouch for packaging fermented foods A into which the fermented food 100 is put.

In that case, the handle 39 may include a molding member (not shown in the figure) that is separately coupled.

As the molding member is gripped, the gripping of the handle 39 may be more stabilized and durability of the handle 30 may be increased.

According to another aspect of the present disclosure, a method of packaging fermented foods includes: preparing a pouch for packaging fermented foods (a); inputting a fermented food (b); and sealing (c).

The preparing a pouch for packaging fermented foods (a) includes preparing a pouch for packaging fermented foods that includes: a body 10 formed in a bag shape; a product inlet 20 formed to communicate with the inside of the body 10; and a gas discharge portion 30 that is formed to communicate with the inside of the body 10 and the product inlet 20 and includes a plural-branched labyrinth sealing portion 31.

Since the product inlet 20 may include the valve 21, gas generated from the fermented food 100 accommodated in the body 10 may also be discharged through the valve 21.

Since the gas discharge portion 30 may include the dot sealing portion 37 (refer to FIG. 5), the robustness and durability of sealing of the gas discharge portion 30 may be increased by the dot sealing portion 37.

In addition, since the gas discharge portion 30 may further include the handle 39, the gripping may be stabilized by the handle 39, thus it may be easy to transport the pouch for packaging fermented foods A according to one or more embodiments of the present disclosure.

The inputting a fermented food (b) includes putting the fermented food 100 into the pouch for packaging fermented foods A.

In that case, since a front end of the fermented food injector 200 is put onto an inner side of the product inlet 20 of the pouch for packaging fermented foods A, the fermented food 100 discharged from the fermented food injector 200 may be smoothly put into the pouch for packaging fermented foods A.

The fermented food injector 200 is removed from the pouch for packaging fermented foods A after the fermented food 100 is put into the same, and following that, the pouch for packaging fermented foods A may be sealed.

The sealing (c) includes sealing the pouch for packaging fermented foods A.

In that case, as an upper end of the product inlet 20 is sealed, the pouch for packaging fermented foods A may be sealed. In addition, the upper end of the product inlet 20 may be sealed along a sealing guide portion.

Here, the sealing of the upper end of the product inlet 20 may include any conventional sealing method as long as the sealing is allowed to be securely maintained. As an example, the sealing may include a heat seal, which may seal gas and the fermented food 100 to prevent the same from being discharged from the product inlet 20.

Folding the product inlet 20 may be further included before or after the sealing (C) the upper end of the product inlet 20. In that case, the product inlet 20 may be folded along the fold guide portion.

Packaging the fermented food 100 using the pouch for packaging fermented foods A according to one or more embodiments of the present disclosure will be described in detail as follows.

The pouch for packaging fermented foods A according to one or more embodiments of the present disclosure includes the product inlet 20 in communication with the inside of the body 10.

Figure 11:
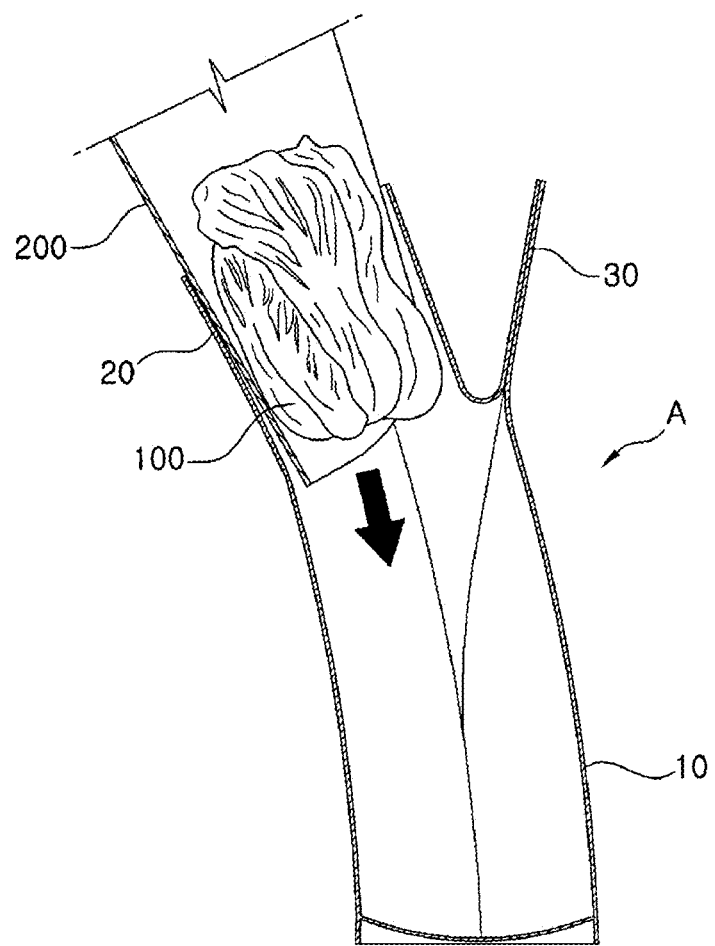
FIG. 11 is an example view illustrating inputting of a fermented food in a method of packaging fermented foods, according to an embodiment of the present disclosure.

As illustrated in FIG. 11, when a front end of the fermented food injector 200 is put into the product inlet 20 having its upper end open, the fermented food 100 discharged from the fermented food injector 200 may be accommodated in the body 10.

Still, the fermented food 100 accommodated in the body 10 may leak through the product inlet 20.

Figure 12:
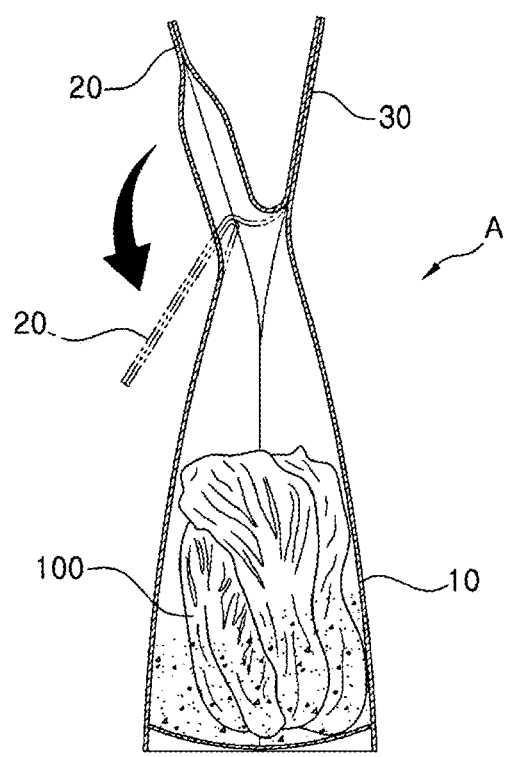
FIG. 12 is an example view illustrating sealing of a product inlet in a method of packaging fermented foods, according to an embodiment of the present disclosure.

According to one or more embodiments of the present disclosure, the upper end of the product inlet 20 is sealed when the fermented food injector 200 is removed after the fermented food 100 is put into the pouch as illustrated in FIG. 12, the fermented food 100 may be prevented from leaking through the product inlet 20.

The pouch for packaging fermented foods A according to one or more embodiments of the present disclosure may be damaged as its volume increases due to gas generated from the fermented food 100 accommodated in the body 10.

However, the pouch for packaging fermented foods A according to one or more embodiments of the present disclosure includes the gas discharge portion 30, thus may be prevented from being damaged as the gas generated from the fermented food 100 accommodated in the body 10 is discharged through the gas discharge portion 30.

In other words, since the labyrinth sealing portion 31 in communication with the inside of the body 10 and the product inlet 20 is formed in the gas discharge portion 30, the gas generated from the fermented food 100 accommodated in the body 10 is discharged through the labyrinth sealing portion 31, thus preventing the pouch for packaging fermented foods A from being damaged due to the generated gas.

Still, when a liquid of the fermented food 100 leaks through the labyrinth sealing portion 31, surroundings may be contaminated and quality of the fermented food 100 may deteriorate.

However, since opening width of the labyrinth sealing portion 31 is not only insignificant, but also plural-branched, only gas may be discharged, and the liquid of the fermented food 100 may be prevented from leaking. Therefore, the contamination of the surroundings and the deterioration of the quality of the fermented food 100 due to the liquid of the fermented food 100 leaking through the labyrinth sealing portion 31 may be prevented.

When a relatively large amount of gas is generated from the fermented food 100 accommodated in the body 10, gas discharge through the labyrinth sealing portion 31 may be hindered. Thus, damage may follow due to the generated gas.

Within the pouch for packaging fermented foods A according to one or more embodiments of the present disclosure, the product inlet 20 may include the valve 21 (refer to FIG. 3). Therefore, when a relatively large amount of gas is generated from the fermented food 100 accommodated in the body 10, gas that is hindered from being discharged from the labyrinth sealing portion 31 may be discharged through the valve 21. Thus, even when a relatively large amount of gas is generated from the fermented food 100 accommodated in the body 10, damage due to the generated gas may be prevented.

In addition, if the gripping of the pouch for packaging fermented foods A according to one or more embodiments of the present disclosure is difficult, transportation or the like of the same may be difficult.

However, within the pouch for packaging fermented foods A according to one or more embodiments of the present disclosure, the gas discharge portion 30 may further include the handle 39 (refer to FIG. 9). Therefore, the gripping may be stabilized by gripping the handle 39, and transportation and the like may become easy, accordingly.

As described above, the pouch for packaging fermented foods A according to one or more embodiments of the present disclosure includes the gas discharge portion 30 including the labyrinth sealing portion 31. Accordingly, the liquid of the fermented food 100 in the body 10 may be prevented from leaking, and at the same time gas generated from the fermented food 100 may be smoothly discharged by the labyrinth sealing portion 31 in the distribution process, thus damage due to the generated gas may be prevented without using a gas absorbent.

In addition, as described above, the gas discharge portion 30 may have the labyrinth sealing portion 31 to discharge gas within the pouch for packaging fermented foods A and to prevent foreign matter from penetrating therein from outside.

The descriptions of a pouch for packaging fermented foods according to an aspect of the present disclosure described above may equally apply to a method of packaging fermented foods according to one or more embodiments of the present disclosure.

Hereinafter, a pouch for packaging 300 will be described with reference to FIGS. 13 to 17 according to another embodiment of the present disclosure.

Figure 13:
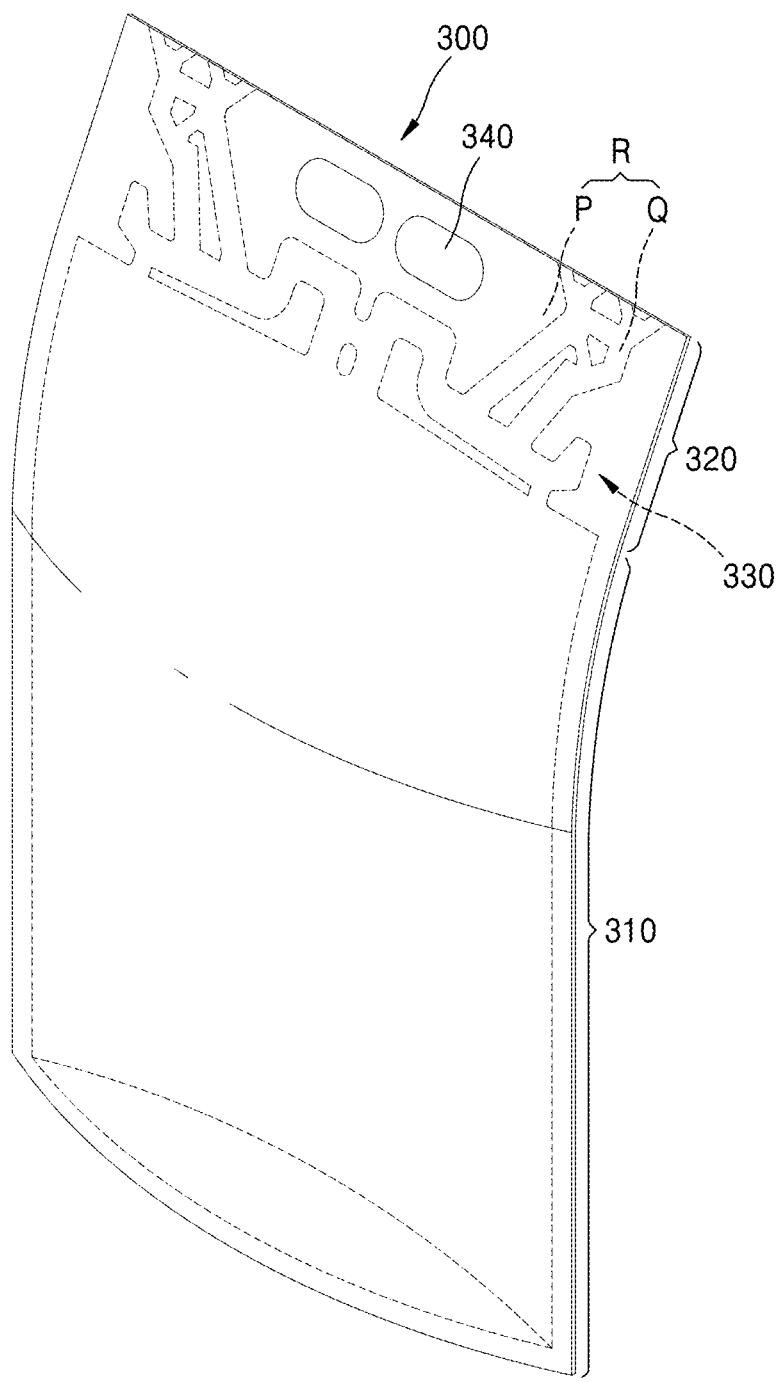
FIG. 13 is a diagram illustrating a pouch for packaging, according to another embodiment of the present disclosure.
Figure 14:
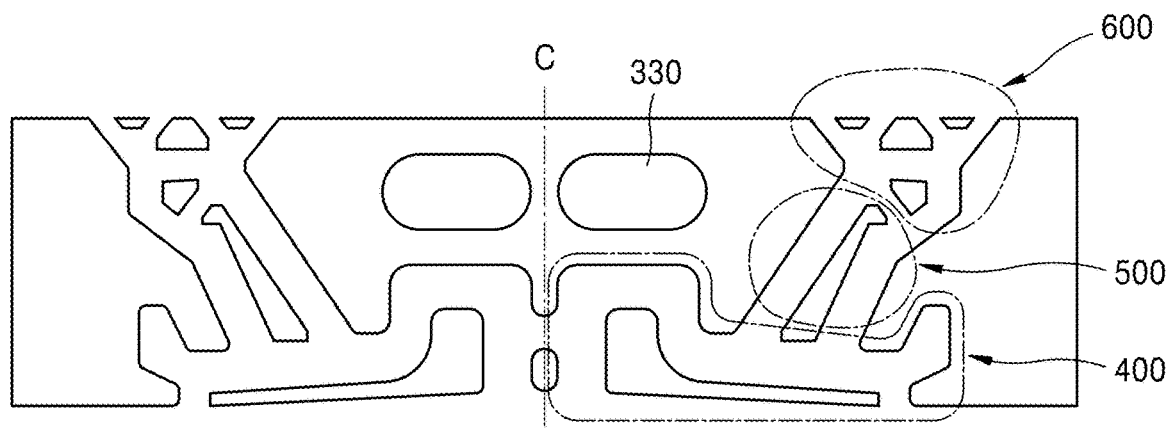
FIG. 14 is an enlarged view illustrating a gas discharge portion of a pouch for packaging, according to another embodiment of the present disclosure.
Figure 15:
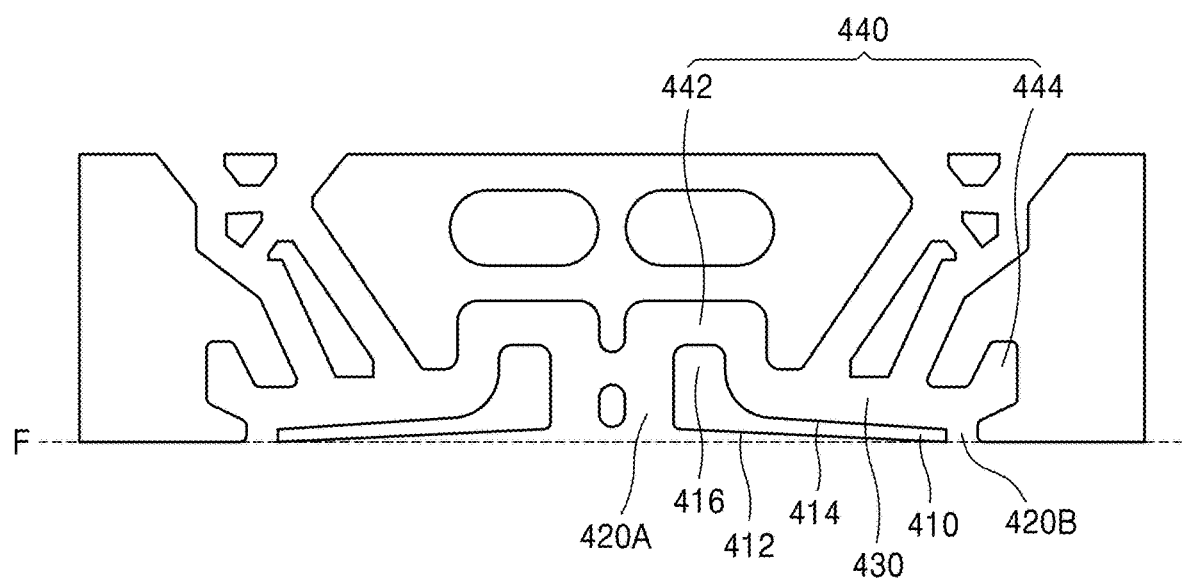
FIGS. 15 to 17 are enlarged views of a first region, a second region, and a third region of a gas discharge portion of a pouch for packaging, respectively, according to another embodiment of the present disclosure.
Figure 16:
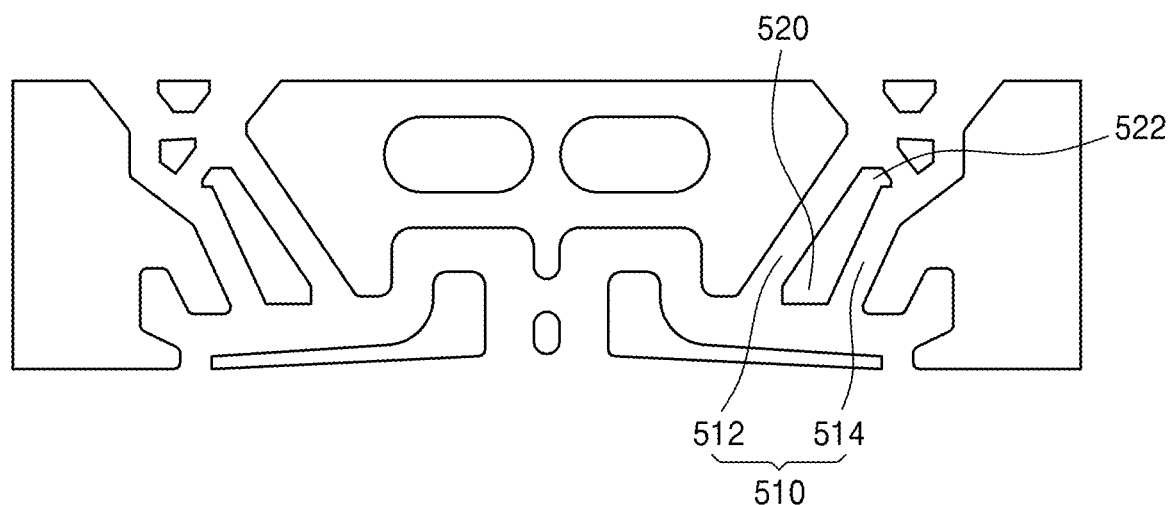
Figure 17:
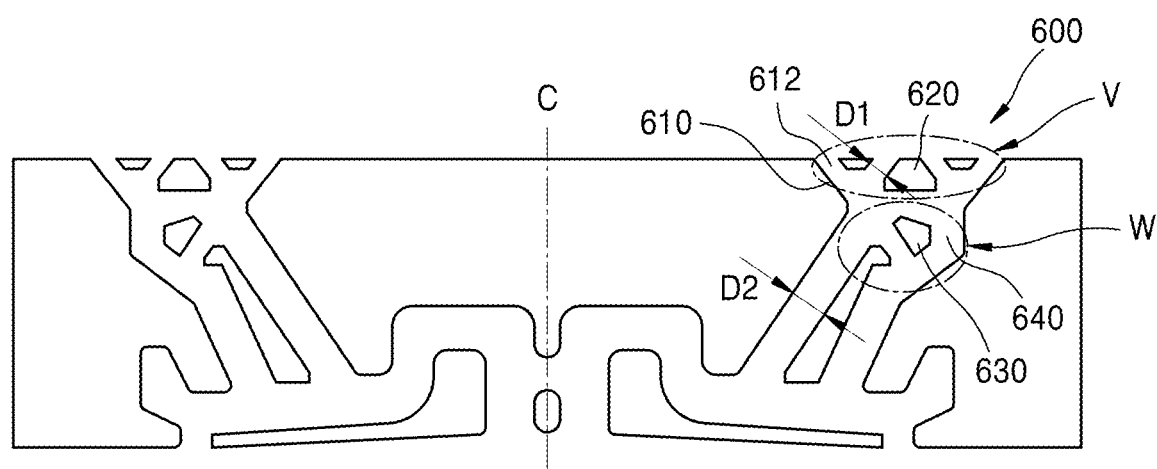

FIG. 13 is a diagram illustrating the pouch for packaging 300 according to another embodiment of the present disclosure, FIG. 14 is an enlarged view illustrating a gas discharge portion 320 of the pouch for packaging 300 according to a second embodiment of the present disclosure, and FIGS. 15 to 17 are enlarged views illustrating a first region 400, a second region 500, and a third region 600 of the gas discharge portion 320 of the pouch for packaging 300, respectively according to a second embodiment of the present disclosure.

The pouch for packaging 300 according to another embodiment of the present disclosure may include a body 310 in a bag shape and the gas discharge portion 320 provided on the body 310.

The pouch for packaging 300 according to the present embodiment is provided with the gas discharge portion 320 through which gas generated from a product in the body 310 is discharged. In that case, a product inlet (not shown) may not be provided separately as shown in FIG. 13, or the product inlet (not shown) and the gas discharge portion 320 may be integrally configured not to be distinguished from each other. For example, when a portion of the bag-shaped body 310 is opened, a product such as a fermented food may be input through the opened portion to utilize the same as a product inlet, and then at least a portion of the opened portion of the bag-shaped body 310 may be sealed to configure the same as the gas discharge portion 320. As another example, another portion of the body 310 other than the gas discharge portion 320 may be opened to input a product and then may be sealed so that only the gas discharge portion 320 remains within the pouch for packaging 300. Of course, the gas discharge portion 320 may be configured separately from the product inlet (not shown).

The body 310 is formed in a bag shape having a certain volume, and fermented foods or the like may be accommodated therein. An upper portion of the body 310 is opened, and the inside thereof communicates with the gas discharge portion 320.

The gas discharge portion 320 includes a plurality of sealing areas P and an open area Q formed between the sealing areas P. In that case, the sealing areas P are disposed to be distributed with a certain surface area, so that the open area Q formed between the sealing areas P constitutes a plurality of through holes to form a labyrinth sealing portion R in a labyrinth shape.

The gas discharge portion 320 may be formed in the process in which thin films made of a vinyl material having a certain thickness and surface area are in surface contact with each other and attached (or it is also possible to bend one thin film so that a portion is in surface contact), and some areas of the vinyl material are closely attached to each other and other areas are spaced apart from each other. The areas closely attached to each other constitute the sealing areas P, and the areas spaced apart from each other constitute the open area Q. However, embodiments of the present disclosure are not limited thereto.

It is desirable that a grip area 330 including the sealing areas P having a certain width be formed on both sides of the gas discharge portion 320 or on both sides of an upper portion of the body 310. As an example, a lower portion of the sealing areas P at both end portions of the gas discharge portion 320 may have a greater width than an upper portion of the sealing areas P at both end portions of the gas discharge portion 320. A user may grip the grip area 330 to move the pouch for packaging 300.

The gas discharge portion 320 or the body 310 may include a rupture portion (not shown) that is able to be ruptured to take a product out of the body 310. The rupture portion (not shown) may be, for example, a portion that is configured to divide the gas discharge portion 320 in a plane direction, or to be able to grip and tear at least a portion of the body 310.

It is desirable that the gas discharge portion 320 be configured to be symmetrical in a lateral direction with a center line C as a center, as illustrated in FIG. 14. In addition, a perforated hook hole 340 having a certain surface area may be formed in the sealing areas P located at the center of the gas discharge portion 320. A plurality of hook holes 340 may be formed to be spaced apart from each other at a certain distance. The user may easily move the pouch for packaging 300 according to one or more embodiments of the present disclosure by holding the hook hole 340 with a finger. Since the plurality of hook holes 340 are formed to be spaced apart from each other at a certain distance, loads may be distributed to prevent the pouch for packaging 300 from stretching or being damaged.

The gas discharge portion 320 includes a first region 400 located at a lower portion, a second region 500 located on the first region 400, and a third region 600 located at an upper portion of the second region 500.

The first region 400 constitutes a lower portion of the gas discharge portion 320, and the lower portion of the gas discharge portion 320 communicates with the inside of the body 310. The first region 400 may include a bottom sealing 410, side open portions 420A and 420B, a bottom line portion 430, and a trap portion 440.

The bottom sealing 410 is a portion including the sealing areas P, is located above a space inside the body 310, and extends with a certain width in a horizontal direction to cover at least a portion of the space inside the body 310. It is desirable that the bottom sealing 410 include a head portion 416 protruding upward. In addition, the head portion 416 may be located at an inner end portion of the bottom sealing 410.

The bottom sealing 410 is surrounded by the open area Q. Accordingly, the side open portions 420A and 420B having a lower end in communication with the inside of the body 310 are formed on an outer side at both end portions of the bottom sealing 410, and the line portion 430 connecting the side open portions 420A and 420B of both sides is formed at an upper portion of the bottom sealing 410.

At least a portion of a lower surface portion 412 of the bottom sealing 410 may have a different height from each other. It is desirable that at least a portion of the lower surface portion 412 of the bottom sealing 410 be configured with an inclined surface having a certain inclination angle, as illustrated in FIG. 15.

As an inclined surface having a certain inclination angle is provided at the lower surface portion 412 of the bottom sealing 410, when a portion between the gas discharge portion 320 and the body 310 is folded, the side open portions 420A and 420B may be prevented from being blocked. For example, when the lower surface portion 412 of the bottom sealing 410 is configured in a straight line in a horizontal direction to have a uniform height, and the side open portions 420A and 420B have the same height, if a portion between the body 310 and the gas discharge portion 320 is folded, the lower surface portion 412 of the bottom sealing 410 and a fold line between the body 310 and the gas discharge portion 320 may coincide with each other. In that case, the side open portions 420A and 420B may be completely blocked. However, according to an embodiment of the present disclosure, the lower surface portion 412 of the bottom sealing 410 has a partially different height. Accordingly, the lower surface portion 412 of the bottom sealing 410 and a fold line F do not coincide with each other. Thus, any one of the side open portions 420A and 420B may deviate from the fold line F to maintain an open state.

It is desirable that at least a portion of an upper surface portion 414 of the bottom sealing 410 also be configured with an inclined surface having a certain inclination angle. It is also desirable that the upper surface portion 414 of the bottom sealing 410 include an inclined surface inclining downward in an outer direction. Therefore, for example, even when the pouch for packaging 300 is turned upside down and a liquid overflows through the side open portions 420A and 420B, if the pouch for packaging 300 returns to its right position, the liquid flows downward along the upper surface portion 414 of the bottom sealing 410. Therefore, the liquid may be recovered into the body 310 through the side open portions 420A and 420B of an outer side of the bottom sealing 410.

The trap portion 440 has an opened lower portion in communication with the inside of the body 310, and is recessed with a certain depth upward. The trap portion 440 is located on the bottom sealing 410. More specifically, a first trap portion 442 in a ∩ shape surrounding the head portion 416 of the bottom sealing 410 may be provided on the side open portion 420A of an inner side of the bottom sealing 410. In addition, a second trap portion 444 protruding upward may be provided on the side open portion 420B of an outer side of the bottom sealing 410. The bottom line portion 430 may connect between the first trap portion 442 and the second trap portion 444.

As the trap portion 440 is provided as described above, when the gas discharge portion 320 is folded, or the pouch for packaging 300 is turned upside down, if the liquid leaks through the side open portions 420A and 420B, the liquid may be trapped in the trap portion 440. Therefore, the liquid may be prevented from leaking.

It is desirable that the trap portion 440 be located on the side open portions 420A and 420B as described above. Thus, the liquid leaking through the side open portions 420A and 420B may first flow into the trap portion 440 to be trapped by the trap portion 440. When the pouch for packaging 300 returns to its right position, the liquid trapped in the trap portion 440 may be easily recovered into the body 310 through the side open portions 420A and 420B.

The second region 500 is located on the first region 400 to connect between the first region 400 and the third region 600 to be described later. The second region 500 includes a connection line 510 having a certain length including the open area Q. The connection line 510 includes a first line 512 and a second line 514 that are formed in a plurality and extend with a certain length. In addition, the first line 512 and the second line 514 extend between a sealing line 520 including the sealing areas P. A lower end portion of the first line 512 and the second line 514 may be connected to the bottom line portion 430 of the first region 400.

The sealing line 520 may have a certain width, and at least a portion thereof may have a different width. For example, a certain head 522 protruding in a side portion may be provided at an upper end portion of the sealing line 520. In addition, the first line 512 and the second line 514 may also be configured in a straight line or may have a certain bend.

Since a plurality of connection lines 510 including the open area Q are formed in the second region 500, gas discharge and recovery of the liquid may be performed at the same time. For example, gas generated from the product may be discharged through the first line 512. In addition, the liquid leaking together with the gas may flow through the second line 514 to be recovered into the body 310.

The third region 600 is located at an upper portion of the second region 500 to be connected to the second region 500.

The third region 600 may include a discharge area V. The discharge area V includes a discharge line 610 that is able to discharge gas. The discharge line 610 includes the open area Q, and an end thereof is connected to a circulation area W (a circulation line 640) to be described later and the other end may be opened to the outside through an exterior of the pouch for packaging 300 to configure an outlet 612 that discharges gas to the outside. It is desirable that a plurality of discharge lines 610 be provided, and a dot-shaped end sealing portion 620 including the sealing areas P be provided between the plurality of discharge lines 610. It is also desirable that the plurality of discharge lines 610 be formed in several branches, and the dot-shaped end sealing portion 620 be provided between the plurality of discharge lines 610. Here, the end sealing portion 620 is not necessarily limited to the fact that the end sealing portion 620 is arranged at an end of the pouch for packaging 300 in accordance with the term. Rather, the end sealing portion 620 collectively refers to the sealing areas P formed within the third region 600.

The circulation area W may be provided within the third region 600. The circulation area W is located between the second region 500 and the discharge area V, and has a circulation structure that returns the liquid that has leaked to the body.

For example, the circulation area W may include one or more isolated dot-shaped circulation sealing 630 including the sealing areas P and the circulation line 640 surrounding the circulation sealing 630 and including the open area Q. In other words, one or more isolated circulation sealing 630 is provided within the circulation area W, and the circulation line 640 surrounds the circulation sealing 630. Thus, when the liquid that has leaked from the body reaches the circulation area W, the liquid flows around the surroundings of the circulation sealing 630 to return to the second region 500 along the circulation line 640. Following that, the liquid may pass through the second region 500 and the first region 400 to return into the body 300. As described above, since the circulation structure including the circulation line 640 surrounding the circulation sealing 630 is provided, the liquid may be prevented from leaking.

It is desirable that the third region 600 be configured in an arrangement in which a plurality of dot-shaped sealing areas P be dispersed, as illustrated in FIG. 17. Therefore, the open area Q within the third region 600 may have a configuration including a labyrinth shape.

According to the present embodiment of the present disclosure, the circulation area W including the circulation structure is provided within the third region 600. However, depending on embodiments, the circulation area W including the circulation structure may be provided at other portions and in various areas. In addition, a portion of the first to third regions 400, 500, and 600 contributes to the circulation of the, thus practically constituting part of the circulation structure. That is, as an example, the circulation sealing 630 includes a certain isolated dot-shaped sealing areas P provided within the first to third regions 400, 500, and 600, and the circulation line 640 may include the open area Q surrounding the sealing areas P. Therefore, a certain isolated dot-shaped sealing areas P provided within the first to third regions 400, 500, and 600 may constitute the circulation sealing 630, and the open area Q surrounding the circulation sealing 630 may constitute the circulation line 640.

As described above, the pouch for packaging 300 according to one or more embodiments of the present disclosure may have the circulation structure in which gas is easily discharged and the liquid that has leaked is easily recovered. Referring to FIG. 17, the open area Q of the pouch for packaging 300 according to one or more embodiments of the present disclosure may have an open structure in the form of a round-about that is circulated based on the circulation sealing 630 including one isolated dot-shaped sealing area P. Thus, whereas the gas may pass through the open area Q to flow out through the outlet 612, the liquid that has leaked may be descended through the first line 512 or the second line 514 due to its weight to return to the body 310 through the side open portion 420B. Such circulation structure prevents a large amount of liquid leaking from flowing out through the outlet 612 even when the pouch for packaging 300 is turned upside down or shaken.

Figure 7:
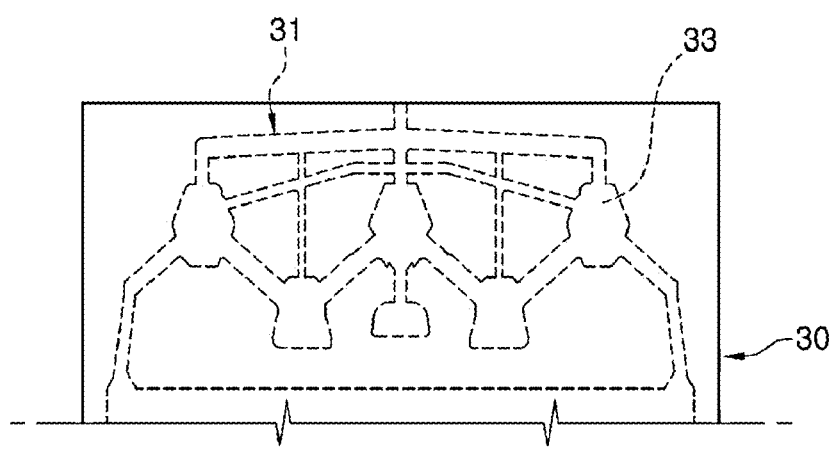
Figure 8:
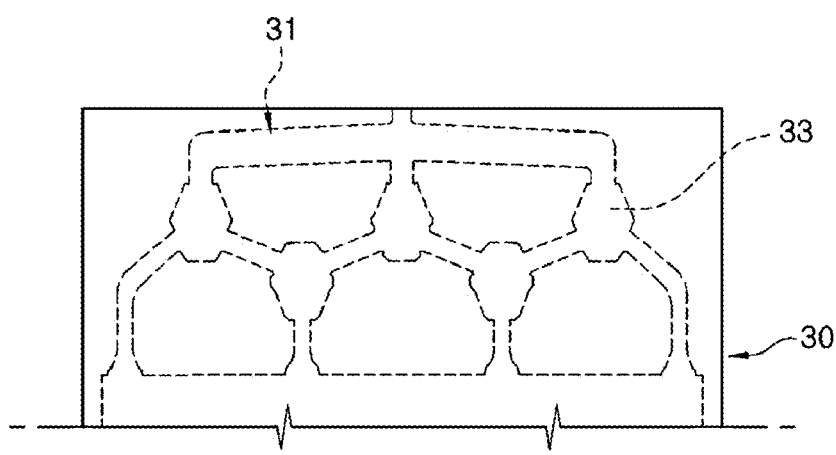

The circulation structure is easy for gas discharge, and may have an integral structure for descending liquids. For example, referring to FIG. 4, the circulation structure may be provided as a one way type through a combination of the upward inclined portion 33a and the downward inclined portion 33b. Referring to FIG. 7, the circulation structure may have a circulation function by a plurality of chambers and a passage connecting each chamber in a net shape. The fact that the trap portion 440 is provided and the upper surface portion 414 of the bottom sealing 410 is configured with an inclined surface may also constitute part of the circulation structure. However, other various circulation structure shapes may be provided, and embodiments of the present disclosure are not limited to specific embodiments and shapes.

It is desirable that a width D1 of the discharge line 610 be less than a width D2 of the connection line 510. For example, the width D1 of the discharge line 610 may range from 4 mm to 10 mm. For example, the width D2 of the connection line 510 may range from 7 mm to 13 mm. Therefore, whereas the gas may be discharged through the discharge line 610, the liquid may be prevented from leaking through the discharge line 610. As described above, since the connection line 510 and the discharge line 610 have a certain numerical range for each width, whereas the gas may be discharged through the connection line 510 and the discharge line 610, the liquid may be prevented from leaking through the connection line 510 and the discharge line 610. In other words, when the width of the connection line 510 and the discharge line 610 is greater than the range described above, the liquid may easily leak, and when the width of the connection line 510 and the discharge line 610 is less than the range described above, it may be difficult for the gas to be discharged.

It is desirable that within the open area Q provided in the gas discharge portion 320, a width of a portion adjacent to an exit (portion adjacent to the outlet 612) be less than a width of a portion adjacent to an entrance (portion adjacent to the body 310). Therefore, since pressure is easily applied from the body 310 in an outer direction, whereas the gas is easily discharged, it is difficult for air from outside and various foreign matters to penetrate through the outlet 612. The gas discharge portion 320 may perform the same function as the one way valve. Accordingly, foreign matter may not penetrate into foods accommodated in the pouch for packaging 300, and hygiene may be secured.

Figure 18:
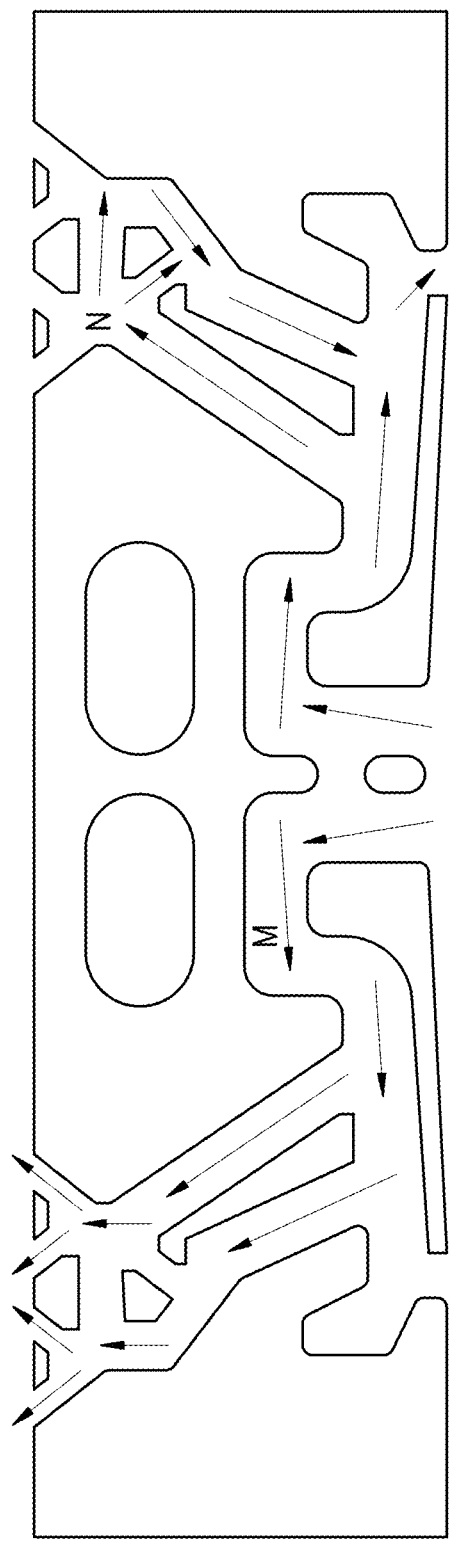
FIG. 18 is a diagram illustrating movement of gas and a liquid within a gas discharge portion, according to another embodiment of the present disclosure.

FIG. 18 is a diagram illustrating movement of gas and a liquid in the gas discharge portion 320 according to an embodiment of the present disclosure. An arrow M on the left in FIG. 18 indicates movement of the gas, and an arrow N on the right in FIG. 18 indicates movement of the liquid (for example, kimchi liquid). Whereas the gas like the arrow M is discharged to the outside, the liquid like the arrow N may be trapped by the trap portion 440 or circulate through the circulation structure to return into the body 310 even when a portion of the liquid leaks into the gas discharge portion 320.

Figure 19:
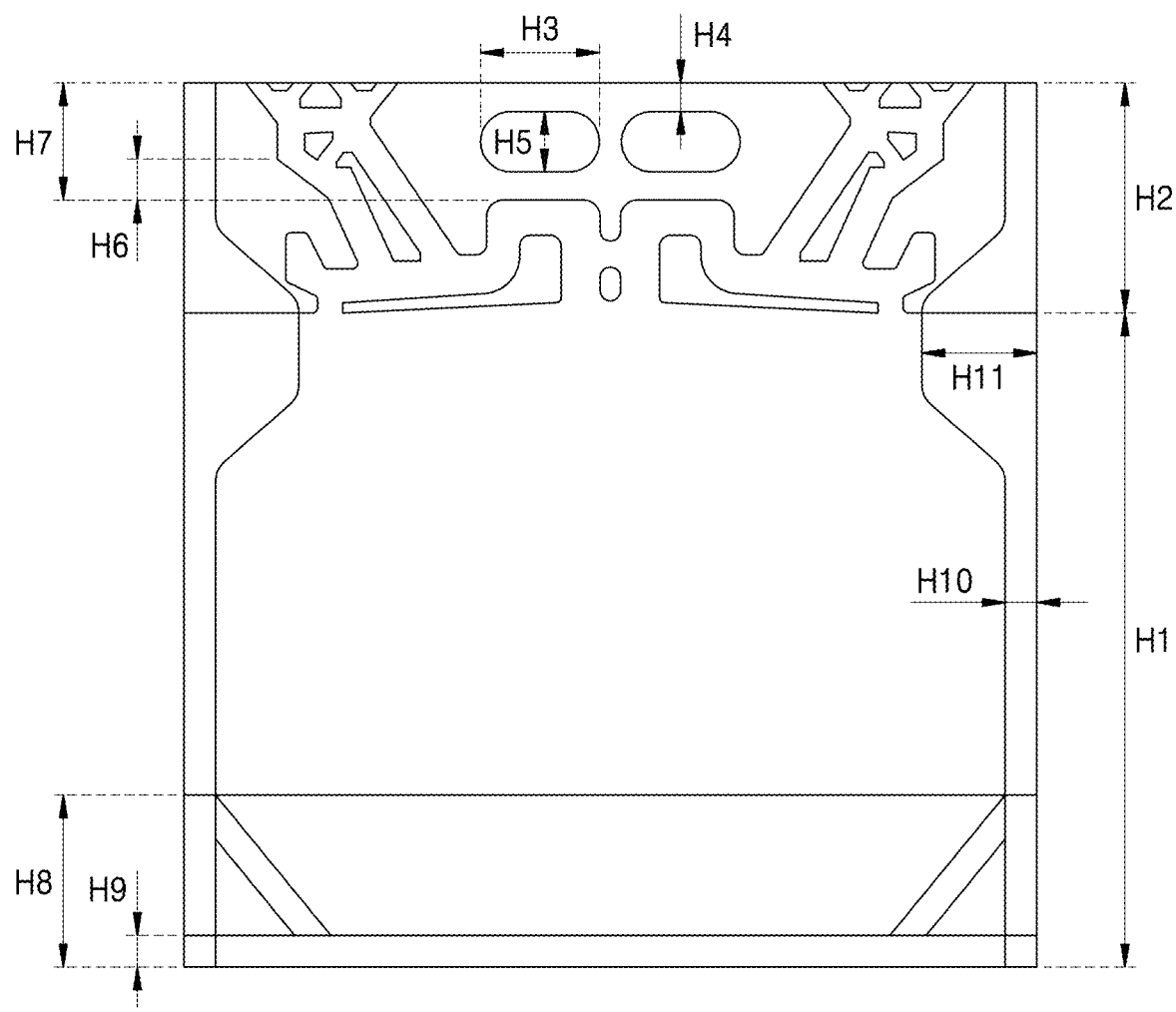
FIG. 19 is a diagram illustrating a dimensional ratio of each portion of a pouch for packaging, according to an embodiment of the present disclosure.

FIG. 19 is a diagram illustrating a dimensional ratio of each portion of the pouch for packaging 300 according to an embodiment of the present disclosure. The dimensional ratio of each portion of the pouch for packaging 300 indicated by H1 to H11 may be, for example, H1:H2:H3:H4:H5:H6:H7:H8:H9:H10:H11=240:80:40:10:20:36:40:60:10:10:40.

As the gas discharge portion 320 according to one or more embodiments of the present disclosure is provided, gas generated from a product may be discharged, and at the same time, a liquid may be prevented from leaking. In addition, foreign matter may be prevented from penetrating into the product, thus securing hygiene.

Figure 20:
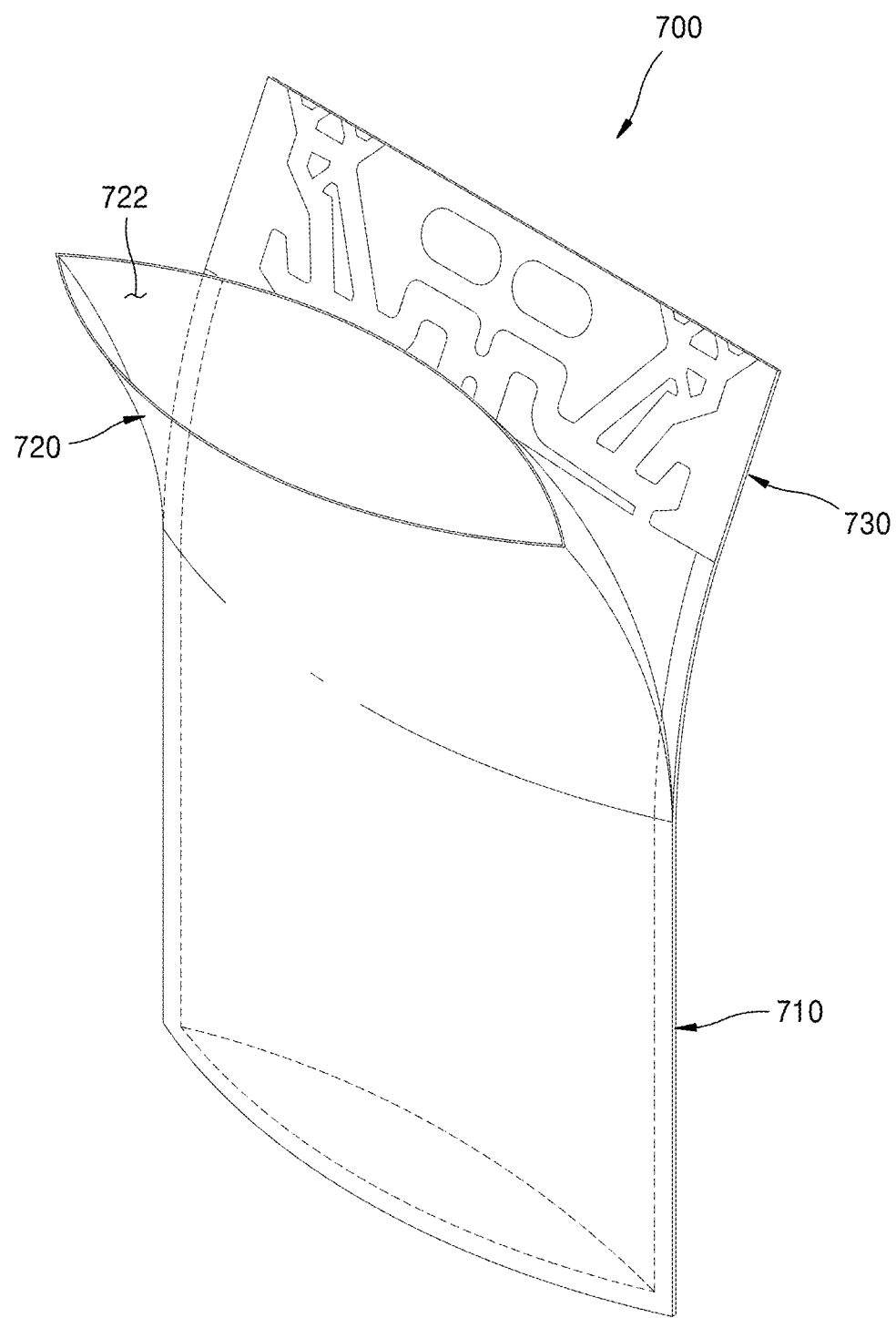
FIGS. 20 and 21 are diagrams illustrating a pouch for packaging, according to another embodiment of the present disclosure.
Figure 21:
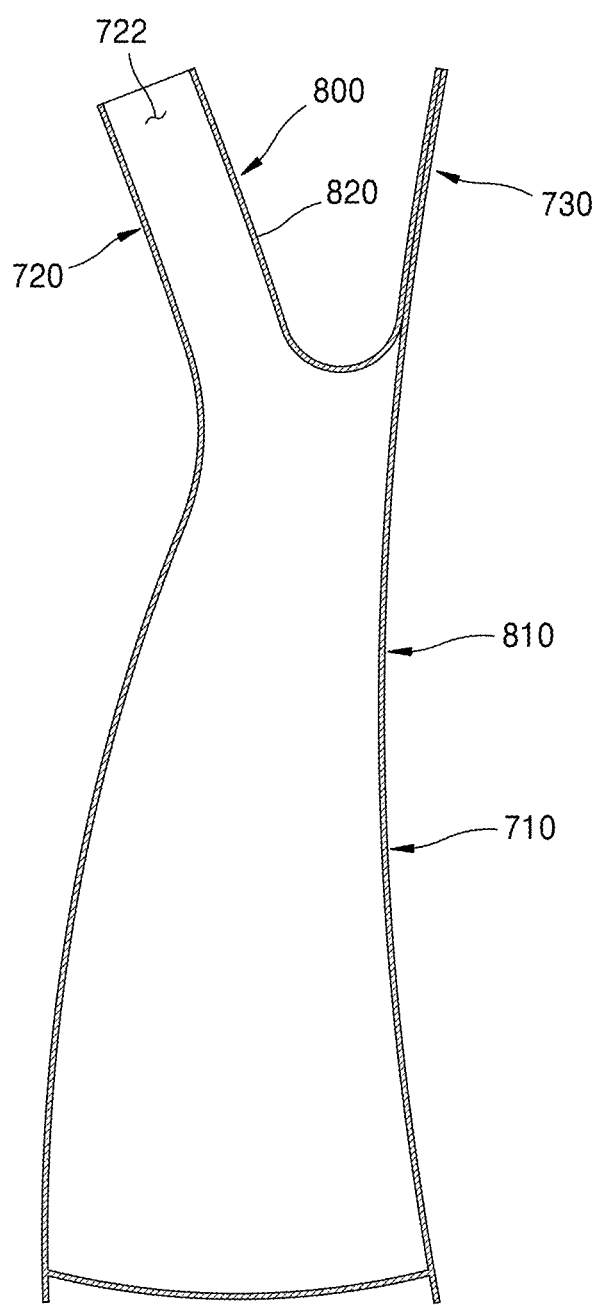

FIGS. 20 and 21 are diagrams illustrating a pouch for packaging 700 according to a third embodiment of the present disclosure.

The pouch for packaging 700 according to another embodiment of the present disclosure includes: a body 710 formed in a bag shape; a product inlet 720 formed to communicate with the inside of the body 710; and gas discharge portion 730 formed to communicate with the inside of the body 710 and the product inlet 720.

The pouch for packaging 700 according to the present embodiment is provided with the product inlet 720 that is in communication with the inside of the body 710 and includes an inlet 722 through which a product is input and the gas discharge portion 730 that discharges gas generated from a product in the body 710, separately from each other.

The product inlet 720 and the gas discharge portion 730 may be provided on at least one side of the body 710, and at least one portion may face each other and overlap.

The pouch for packaging 700 may include an outer skin portion 810 and an inner skin portion 820. The outer skin portion 810 forms an outer surface of the body 710, the product inlet 720, and the gas discharge portion 730. The inner skin portion 820 may form an inner surface on which the product inlet 720 and the gas discharge portion 730 face each other. In that case, the inner surface of the product inlet 720 and the gas discharge portion 730 may be formed integrally by one inner skin portion 820, and the inner skin portion 820 may be configured in a U shape so that an outer surface of both sides may be attached to an inner surface of the outer skin portion 810 as illustrated in FIG. 21.

The gas discharge portion 730 may have a configuration in which the inner skin portion 820 the outer skin portion 810 are adhered with a certain pattern, and an exhaust area may be formed between a certain sealing area. As an example, the pattern may correspond to a shape of the sealing area and may be configured as an area onto which an adhesive is applied.

Since the product inlet 720 and the gas discharge portion 730 are provided according to an embodiment of the present disclosure, a product may be easily put into or taken out of the body 710, and gas generated from the inside of the body 710 may be discharged. In particular, since the outer skin portion 810 and the inner skin portion 820 are provided and the inner skin portion 820 forms an inner surface of the product inlet 720 and the gas discharge portion 730 according to an embodiment, the manufacturing process of the product inlet 720 and the gas discharge portion 730 may be simplified, thus reducing the manufacturing costs.

While one or more embodiments have been described with reference to the figures, the descriptions of the above-described embodiments are merely examples, and it will be understood by one of ordinary skill in the art that various changes and equivalents thereof may be made. Therefore, the scope of the disclosure should be defined by the appended claims, and all differences within the scope equivalent to those described in the claims will be construed as being included in the scope of protection defined by the claims.

What is claimed is:

1. A pouch for packaging comprising:
a body formed in a bag shape and
a gas discharge portion including a labyrinth sealing portion that is in communication with the inside of the body and includes a plurality of sealing areas and an open area between the sealing areas,
wherein the gas discharge portion comprises:
a first region that is located at a lower portion and a portion thereof is in communication with the inside of the body;
a second region that is located on the first region to be connected to the first region and includes a connection line of a certain length; and
a third region that is located at an upper portion of the second region to be connected to the second region and includes a discharge line,
the gas discharge portion
comprises a circulation area having a certain surface area, in which a circulation structure that returns a leaking liquid to the body is formed, and
the first region comprises:
a bottom seal that includes the sealing areas, is located on the body, and has a certain width in a horizontal direction to cover at least a portion of an interior space of the body;
a side open portion that includes the open area and is located on both sides of the bottom seal; and
a bottom line that includes the open area and is located on the bottom seal.

2. The pouch for packaging of claim 1, wherein the circulation structure comprises
one or more circulation seals including the sealing areas and
a circulation line including the open area and surrounding one or more circulation seals.

3. The pouch for packaging of claim 1, wherein the circulation area is located within the third region, and also located between the second region and the discharge line.

4. The pouch for packaging of claim 3, wherein a width of the discharge line is less than a width of the connection line.

5. The pouch for packaging of claim 1, wherein a grip area including the sealing areas and having a certain width is provided on both sides of the gas discharge portion or on both sides of an upper portion of the body.

6. The pouch for packaging of claim 1, wherein the gas discharge portion is configured to be symmetrical in a lateral direction, and
> a plurality of perforated hook holes having a certain surface area are formed at a certain distance from each other at a central portion of the gas discharge portion.

7. The pouch for packaging of claim 1, wherein the gas discharge portion or the body comprises a rupture portion that is able to be ruptured so that contents are taken out.

8. The pouch for packaging of claim 1, wherein the bottom seal is configured with a lower surface portion, of which at least a portion includes an inclined surface having a certain inclination angle.

9. The pouch for packaging of claim 1, wherein the bottom seal is configured with an upper surface portion, of which at least a portion includes an inclined surface having a certain inclination angle.

10. The pouch for packaging of claim 1, wherein the first region comprises a trap portion that includes the open area and is located on the bottom seal, and a lower portion of the trap portion is in communication with the inside of the body and recessed with a certain depth upward.

11. The pouch for packaging of claim 10, wherein the trap portion is located at both end portions of the bottom seal to be located on the side open portions.

12. The pouch for packaging of claim 1, wherein the connection line comprises a first line and a second line including the open area and extending with a certain length, and
> the first line and the second line extend between a sealing line including the sealing areas.

\* \* \* \* \*